(12) United States Patent
Kim

(10) Patent No.: US 10,224,350 B2
(45) Date of Patent: Mar. 5, 2019

(54) MASK FOR DEPOSITION, APPARATUS FOR MANUFACTURING DISPLAY APPARATUS HAVING THE SAME, AND METHOD OF MANUFACTURING DISPLAY APPARATUS WITH MANUFACTURING DISPLAY APPARATUS HAVING MASK FOR DEPOSITION

(71) Applicant: Samsung Display Co., Ltd., Yongin-Si, Gyeonggi-Do (KR)

(72) Inventor: Sanghoon Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/106,898

(22) Filed: Aug. 21, 2018

(65) Prior Publication Data

US 2018/0358389 A1    Dec. 13, 2018

Related U.S. Application Data

(62) Division of application No. 15/406,869, filed on Jan. 16, 2017, now Pat. No. 10,083,997.

(30) Foreign Application Priority Data

Feb. 29, 2016  (KR) .................. 10-2016-0024718

(51) Int. Cl.
*H01L 51/00* (2006.01)
*H01L 51/56* (2006.01)
(Continued)

(52) U.S. Cl.
CPC ........ *H01L 27/1288* (2013.01); *B05C 21/005* (2013.01); *H01L 27/127* (2013.01); *H01L 27/3244* (2013.01); *H01L 51/0011* (2013.01)

(58) Field of Classification Search
CPC ............ H01L 27/3244; H01L 51/0011; H01L 27/1288; H01L 51/56; H01L 2227/32;
(Continued)

(56) References Cited

U.S. PATENT DOCUMENTS 10,083,997 B2 *  9/2018  Kim .................. H01L 27/127
2014/0290574 A1  10/2014  Kim
(Continued)

FOREIGN PATENT DOCUMENTS

JP     2009-041061 A   2/2009
JP   1020100073734 A   7/2010
(Continued)

*Primary Examiner* — Caleen Sullivan
(74) *Attorney, Agent, or Firm* — Cantor Colburn LLP

(57) ABSTRACT

A deposition mask includes a deposition pattern through which a deposition material passes and a distal end extended in a length direction of the deposition mask from the deposition pattern. The distal end includes a dummy pattern between a clamping groove and the deposition pattern in the length direction. The clamping groove and the dummy pattern are provided in plural along a second direction crossing the length direction. In the length direction of the deposition mask, the number of clamping grooves and dummy patterns correspond to each other, the clamping grooves respectively overlap a corresponding dummy pattern, a distal end area at which clamping grooves overlap the corresponding dummy pattern defines a second area of the distal end, and a distal end area at which the clamping grooves do not overlap the corresponding dummy pattern defines a first area of the distal end to which a clamp is applied.

4 Claims, 12 Drawing Sheets

(51) Int. Cl.
  *H01L 27/12* (2006.01)
  *B05C 21/00* (2006.01)
  *H01L 27/32* (2006.01)

(58) Field of Classification Search
  CPC .. H01L 2251/56; C23C 14/042; B05C 21/005
  USPC ............................. 438/151; 216/12; 118/504
  See application file for complete search history.

(56) References Cited

U.S. PATENT DOCUMENTS

| | | | |
|---|---|---|---|
| 2016/0369389 A1 | 12/2016 | Ko | .................. C23C 14/042 |
| 2017/0001259 A1 | 1/2017 | Han | .................. B23K 37/0435 |

FOREIGN PATENT DOCUMENTS

| | | |
|---|---|---|
| KR | 2019990013430 U | 4/1999 |
| KR | 1020090124356 A | 12/2009 |
| KR | 1020140118507 A | 10/2014 |

* cited by examiner

Wrinkle Peak to Peak : 701μm

Wrinkle Peak to Peak : 582μm

MASK FOR DEPOSITION, APPARATUS FOR MANUFACTURING DISPLAY APPARATUS HAVING THE SAME, AND METHOD OF MANUFACTURING DISPLAY APPARATUS WITH MANUFACTURING DISPLAY APPARATUS HAVING MASK FOR DEPOSITION

This application is a divisional application of U.S. application Ser. No. 15/406,869 filed Jan. 16, 2017, which claims priority to Korean Patent Application No. 10-2016-0024718, filed on Feb. 29, 2016, and all the benefits accruing therefrom under 35 U.S.C. § 119, the contents of which in their entirety are herein incorporated by reference.

BACKGROUND

1. Field

One or more embodiments relate to an apparatus and a method, and more particularly, to a mask for deposition, an apparatus to manufacture a display apparatus, and a method of manufacturing the display apparatus using the apparatus to manufacture a display apparatus.

2. Description of the Related Art

Mobile electronic apparatuses have been widely used. The mobile electronic apparatuses include a relatively small electronic apparatus, such as a mobile phone and a tablet personal computer ("PC").

Since such a mobile electronic apparatus supports various functions, the mobile electronic apparatus includes a display apparatus to provide a user with visual information such as an image and a motion picture. As components of the mobile electronic apparatus to drive the display apparatus thereof are minimized in size, the display apparatus becomes more important in the mobile electronic apparatus. A structure, in which the display apparatus is bent at a predetermined angle from a flat state thereof, is being developed.

SUMMARY

One or more embodiments include a mask for deposition, an apparatus including the mask for deposition to manufacturing a display apparatus, and a method of manufacturing the display apparatus using the apparatus including the mask for deposition to manufacturing a display apparatus.

Additional features will be set forth in part in the description which follows and, in part, will be apparent from the description, or may be learned by practice of the presented embodiments.

According to one or more embodiments, a deposition mask for depositing a deposition material on a substrate includes a deposition pattern unit including a plurality of deposition pattern holes through which the deposition material passes to the substrate; and a distal end extended in a first direction of the deposition mask from the deposition pattern unit to a distal edge of the deposition mask. The distal end includes a clamping groove open at the distal edge of the deposition mask; and a dummy pattern unit disposed between the clamping groove and the deposition pattern unit in the first direction of the deposition mask. The clamping groove and the dummy pattern unit are provided in plural along a second direction crossing the first direction of the deposition mask. In the first direction of the deposition mask, a portion of each clamping groove overlaps a corresponding dummy pattern unit, in the second direction of the deposition mask, the number of the clamping grooves and the number of the dummy pattern units correspond to each other, an area of the distal end at which the portion of the distal end does not overlap the corresponding dummy pattern unit defines a first area of the distal end to which a clamp is applied, and an area of the distal end at which the portion of each clamping groove overlaps the corresponding dummy pattern unit defines a second area of the distal end.

According to one or more embodiments, the dummy pattern unit may include a plurality of dummy pattern holes, and a shape of one of the plurality of dummy pattern holes may correspond to a shape of one of the plurality of deposition pattern holes.

According to one or more embodiments, the dummy pattern unit may include a plurality of dummy pattern holes, and a shape of one of the plurality of dummy pattern holes may be different from a shape of one of the plurality of deposition pattern holes.

According to one or more embodiments, in the first direction of the deposition mask, the dummy pattern unit may include a first pattern unit and a second pattern unit spaced apart from each other. Each of the first and second pattern units may include a plurality of dummy pattern holes.

According to one or more embodiments, an apparatus for manufacturing a pattern on a substrate of a display apparatus includes a deposition mask frame assembly facing the substrate, and a deposition source facing the deposition mask frame assembly to dispose the deposition mask frame assembly between the substrate and the deposition source. The deposition mask frame assembly includes a frame having an opening at a center portion thereof, a deposition mask which is installed on the frame to face the substrate, a first of the deposition mask extended in a first direction, and a support of which a length thereof extends in a second direction crossing the first direction and across the opening of the frame, the support overlapping a portion of the deposition mask, and supporting the deposition mask which is installed on the frame. The deposition mask is extendable along the first direction thereof by a force applied thereto by a clamp attached to the deposition mask. The deposition mask includes a deposition pattern unit having a plurality of deposition pattern holes through which a deposition material for forming the pattern passes to the substrate, and a distal end to which the clamp is attached, the distal end extended in the first direction of the deposition mask from the deposition pattern unit to a distal edge of the deposition mask. The distal end includes a clamping groove open at the distal edge of the deposition mask; and a dummy pattern unit disposed between the clamping groove and the deposition pattern unit in the first direction of the deposition mask. The clamping groove and the dummy pattern unit are provided in plural along the second direction. In, the first direction of the deposition mask, a portion of each clamping groove overlaps a corresponding dummy pattern unit, in the second direction of the deposition mask, the number of the clamping grooves and the number of the dummy pattern units correspond to each other, an area of the distal end at which the portion of distal end does not overlap the corresponding dummy pattern unit defines a first area of the distal end to which a clamp is applied, and an area of the distal end at which the portion of each clamping groove overlaps the corresponding dummy pattern unit defines a second area of the distal end.

According to one or more embodiments, the dummy pattern unit may include a plurality of dummy pattern holes, and a shape of one of the plurality of the dummy pattern holes may correspond to a shape of one of the plurality of the deposition pattern holes.

According to one or more embodiments, the dummy pattern unit may include a plurality of dummy pattern holes, and a shape of one of the plurality of dummy pattern holes may be different from a shape of one of the plurality of deposition pattern holes.

According to one or more embodiments, in the first direction of the deposition mask, the dummy pattern unit may include a first dummy pattern unit and a second dummy pattern unit spaced apart from each other. Each of the first dummy pattern unit and a second dummy pattern unit may include a plurality of dummy pattern holes.

According to one or more embodiments, the deposition mask frame assembly may further include a welding portion to couple the frame and the deposition mask to each other. The welding portion is disposed at the distal end of the deposition mask.

According to one or more embodiments, in the first direction of the deposition mask, the welding portion may be installed between the pattern unit and the dummy pattern unit.

According to one or more embodiments, a method of manufacturing a display apparatus having a pattern on a substrate includes inserting the substrate and a deposition mask assembly into an inside of a deposition chamber, aligning the substrate and the deposition mask frame assembly with each other, and depositing on the substrate a deposition material for forming the pattern by ejecting the deposition material from a deposition source and passing the ejected deposition material through the deposition mask frame assembly to the substrate The deposition mask frame assembly includes a frame having an opening at a center portion thereof, a deposition mask which is installed on the frame to face the substrate, a length of the deposition mask extended in a first direction, and a support of which a length thereof extends in a second direction crossing the first direction and across the opening of the frame, the support overlapping a portion of the deposition mask and supporting the deposition mask which is installed on the frame. The deposition mask is extendable along the first direction thereof by a force applied thereto by a clamp attached to the deposition mask. The deposition mask includes a pattern unit including a plurality of deposition pattern holes through which the ejected deposition material passes, and a distal end to which the clamp is attached, the distal end extended in the first direction of the deposition mask from the deposition pattern unit to a distal edge of the deposition mask. The distal end includes a clamping groove open at the distal edge of the deposition mask and a dummy pattern unit disposed between the clamping unit and the pattern unit in the first direction of the deposition mask. The dummy pattern unit and the clamping groove are disposed in plural along the second direction. In the first direction of the deposition mask, a portion of each clamping groove overlaps a corresponding dummy pattern unit, in the second direction of the deposition mask, the number of the clamping grooves and the number of the dummy pattern units correspond to each other, an area of the distal end at which the portion of the distal end does not overlap the corresponding dummy pattern unit defines a first area of the distal end to which a clamp is applied, and an area of the distal end at which the portion of each clamping groove overlaps the corresponding dummy pattern unit defines a second area of the distal end.

According to one or more embodiments, the dummy pattern unit may include a plurality of dummy pattern holes, and a shape of one of the plurality of the dummy pattern holes may correspond to a shape of one of the plurality of deposition pattern holes.

According to one or more embodiments, the dummy pattern unit may include a plurality of dummy pattern holes, and a shape of one of the plurality of the dummy pattern holes may be different from a shape of one of the plurality of deposition pattern holes.

According to one or more embodiments, in the first direction of the deposition mask, the dummy pattern unit may include a first dummy pattern unit and a second dummy pattern unit spaced apart from each other. Each of the first and second dummy pattern units may include a plurality of dummy pattern holes.

According to one or more embodiments, the deposition mask frame assembly may further include a welding portion which couples the frame and the deposition mask to each other. The welding portion is disposed at the distal end of the deposition mask.

According to one or more embodiments, in the first direction of the deposition mask, the welding portion may be disposed between the pattern unit and the dummy pattern unit.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Figure 1:
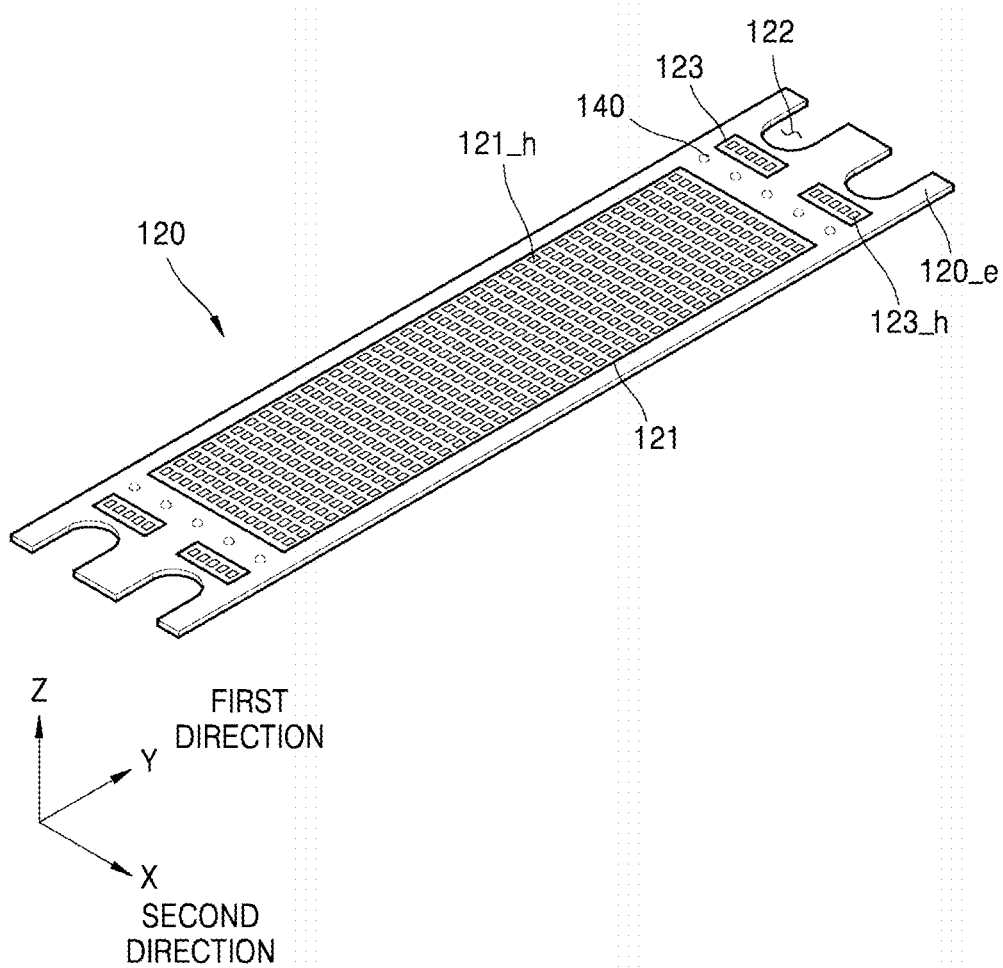
FIG. 1 is a perspective view schematically illustrating an exemplary embodiment of a deposition mask according to the invention.

The exemplary embodiments may have different forms and embodiments and should not be construed as being limited to the descriptions set forth herein. Accordingly, the exemplary embodiments are merely described below, by referring to the figures, to explain features of the present description.

It will be understood that although the terms "first," "second," etc., may be used herein to describe various components, these components should not be limited by these terms. These components are only used to distinguish one component from another.

It will be understood that when an element is referred to as being "on" another element, it can be directly on the other element or intervening elements may be present therebetween. In contrast, when an element is referred to as being "directly on" another element, there are no intervening elements present.

As used herein, the singular forms "a," "an" and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components.

Sizes of elements in the drawings may be exaggerated for convenience of explanation. In other words, since sizes and thicknesses of components in the drawings are arbitrarily illustrated for convenience of explanation, the following embodiments are not limited thereto. When a certain embodiment may be implemented differently, a specific process order may be performed differently from the described order. For example, two consecutively described processes may be performed substantially at the same time or performed in an order opposite to the described order.

In the following examples, the x-axis, the y-axis and the z-axis are not limited to three axes of the rectangular coordinate system, and may be interpreted in a broader sense. For example, the x-axis, the y-axis and the z-axis may be perpendicular to one another, or may represent different directions that are not perpendicular to one another.

As used herein, the term "and/or" includes any and all combinations of one or more of the associated listed items. Expressions, such as "at least one of," when preceding a list of elements, modify the entire list of elements and do not modify the individual elements of the list.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Reference will now be made in detail to embodiments, examples of which are illustrated in the accompanying drawings, where like reference numerals refer to like elements throughout.

As a component to drive a display apparatus within a mobile apparatus, an electrode includes an organic material or a metal material. The electrode of the display apparatus is manufactured by using a vacuum deposition method of forming a thin film by depositing a material on a substrate in a vacuum environment. The vacuum deposition method includes placing inside a vacuum chamber, a substrate on which an organic thin film is to be formed, attaching to the substrate, a mask for deposition which includes the same pattern as the organic thin film to be formed, vaporizing a source organic material by using a deposition source, and then depositing the vaporized organic material onto the substrate via the mask for deposition.

In order to manufacture a relatively high resolution display apparatus, the substrate and the frame are held in relatively close-contact during a manufacturing process to avoid generating an undesirable shadow phenomenon thereby.

A mask for deposition, which is used in a deposition method process for forming a thin film, has become relative thinner to realize a high resolution of a display apparatus. However, when opposite ends of the mask are extended and then are welded to a frame during the deposition method process, wrinkles are formed between a portion of the mask to which a tensile force is applied and another portion of the mask to which the tensile force is not applied. If the wrinkles are formed in the mask for deposition, the substrate on which the thin film is to be formed and the mask for deposition are not in close contact with each other, and thus the shadow phenomenon occurs.

Before a mask for deposition (hereinafter, "mask for deposition" is referred to as "deposition mask," for example, a deposition mask 120 of FIG. 1) according to an embodiment of the invention is described, a deposition mask 120P according to the prior art will be briefly described with reference to FIG. 2.

Figure 2:
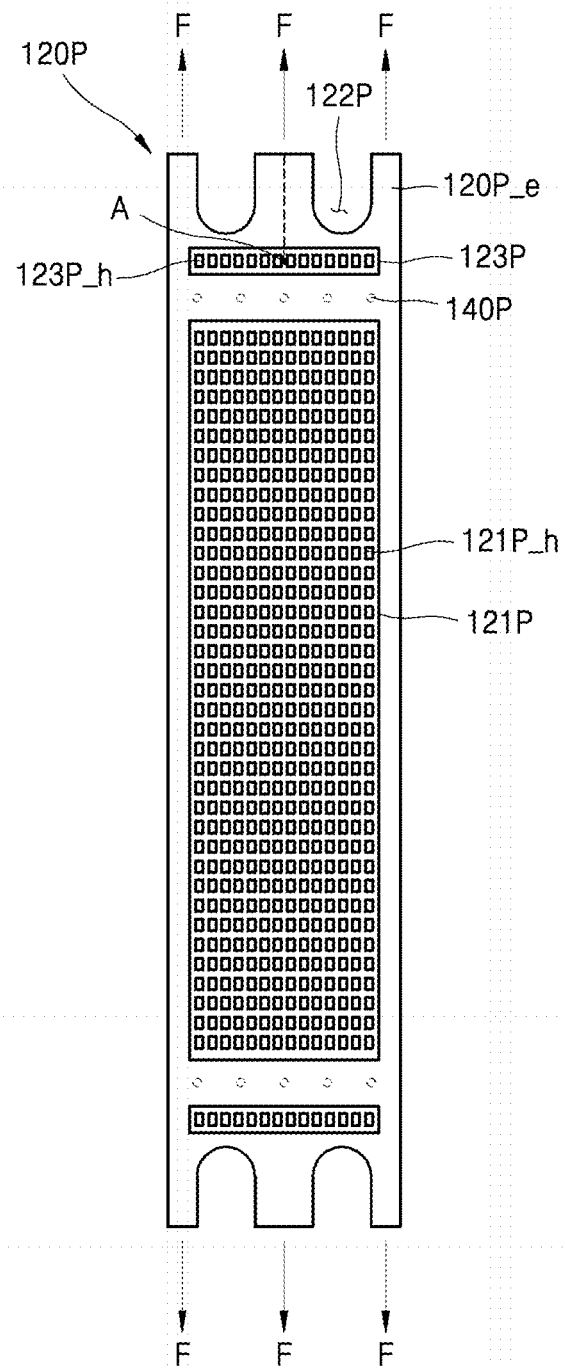
FIG. 2 is a top plan view illustrating a conventional deposition mask.

FIG. 2 is a top plan view of the deposition mask 120P according the prior art.

Referring to FIG. 2, the deposition mask 120P is used in a process of depositing an organic material or a metal material on a substrate (for example, a substrate 11 of FIG. 9A) of a display apparatus. In order to avoid a shadow phenomenon, while both distal ends 120P_e of the deposition mask 120P are clamped such as by a clamp, the deposition mask 120P is extended to be in an extension state thereof. While the deposition mask 120P is in the extension state, the extended deposition mask 120P is welded on a frame (for example, a frame 110 of FIG. 8). Here, the "shadow phenomenon" may be referred to as a phenomenon to cause a display defect to the substrate 11 when the substrate 11 and the deposition mask 120P are not in close contact with each other such that a gap is formed between the substrate 11 and the deposition mask 120P, and the gap allows a deposition material to be deposited on an area of the substrate 11 other than a predetermined effective area of the substrate 11.

In detail, the clamp clamps the distal ends 120P_e of the deposition mask 120P in a clamped state thereof before the deposition mask 120P is welded to the frame 110. While the distal ends 120P_e is in the clamped state, then the deposition mask 120P is extended by applying a tensile force (F in FIG. 2) to portions of the deposition mask 120P in a direction in which the distal ends 120P_e of the deposition mask 120P are away from a center of the deposition mask 120P. For example, the tensile force (F) may be applied to the deposition mask 120P along a length dimension thereof, relative to a center of the length dimension. Thereafter, while the tensile force is applied to the deposition mask 120P, the distal ends 120P_e of the deposition mask 120P are placed on the frame 110, and the frame 110 and the deposition mask 120P are welded to each other such as according to a welding process.

Referring to FIG. 2, the frame 110 and the deposition mask 120P may be coupled to each other at a welding portion 140P of the deposition mask 120P. Here, the welding portion 140P is represented by a broken line since the deposition mask 120P illustrated in FIG. 2 is not welded to the frame 110 and is separate therefrom. After the welding process, portions of the distal ends 120P_e of the deposition mask 120P, which protrude further than edges of the frame 110, are removed. In detail, the portions of the distal ends 120P_e of the deposition mask 120P, which are disposed outside the welding portion 140P relative to the center of the deposition mask 120P, may be removed.

An area of the respective distal ends 120P_e of the deposition mask 120P, which is clamped by the clamp, is referred as a first area of the deposition mask 120P. In the top plan view of FIG. 2, the deposition mask 120P defines a length dimension thereof (vertical in FIG. 2) larger than a width dimension thereof (horizontal in FIG. 2). A direction in which the length dimension of the deposition mask 120P is extended, is referred to as a first direction (Y axis direction). The above-described first area and first direction of the deposition mask 120P may also be used in the exemplary embodiment of the deposition mask 120 of FIG. 1 according to the invention.

Figure 3:
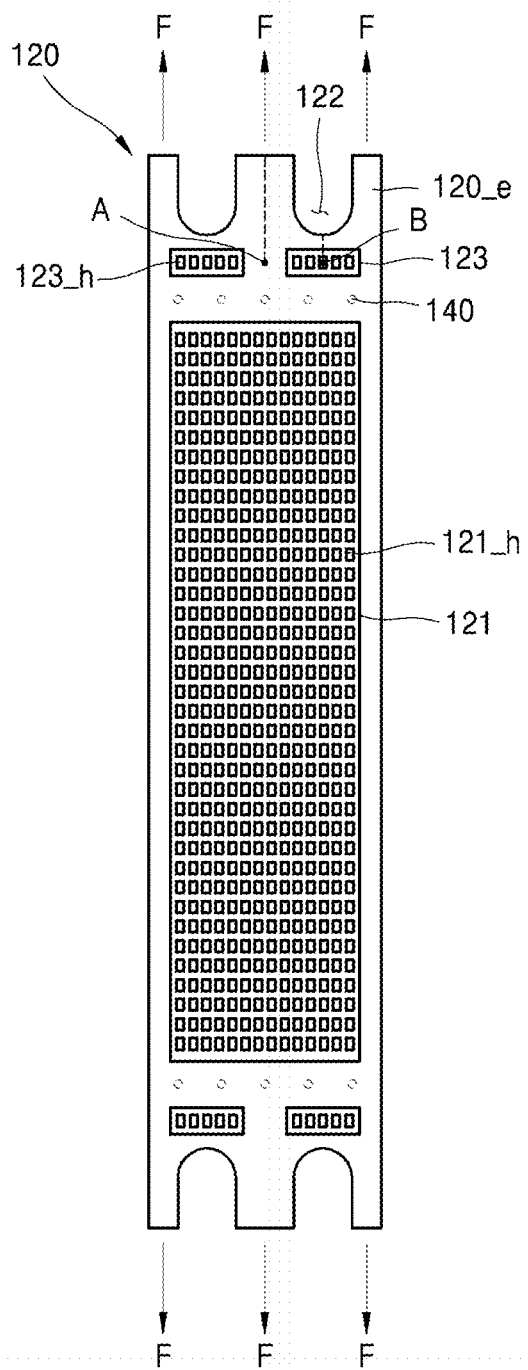
FIG. 3 is a top plan view illustrating the deposition mask of FIG. 1.

FIG. 1 is a perspective view schematically illustrating an exemplary embodiment of the deposition mask 120 according to the invention, FIG. 2 is a top plan view illustrating a deposition mask 120P according to the prior art; and FIG. 3 is a top plan view illustrating the deposition mask 120 of FIG. 1.

Referring to FIG. 1, the deposition mask 120 may include a deposition pattern unit 121 (hereinafter referred to as a "pattern unit 121"), a clamping groove 122 provided in plural and a dummy pattern unit 123 provided in plural. In the top plan view, the clamping groove 122 is recessed from a distal edge of the deposition mask 120 toward the dummy pattern unit 123.

Since the deposition mask 120 of FIG. 1 is not combined with a frame 110 and disposed separate from the frame 110, a welding portion 140 is not formed on the deposition mask 120, and thus a position at which the welding portion 140 would be formed is indicated by a broken line as illustrated in FIG. 1. The welding portion 140 will be described in detail later together with a manufacturing apparatus 10, which manufactures a display apparatus, with reference to FIG. 8.

The pattern unit 121 includes a plurality of deposition pattern holes 121_h (hereinafter referred to as "pattern holes 121_h") through which a deposition material passes to a substrate which will be described later. The pattern holes 121_h extend through an entire thickness of the deposition mask 120. The plurality of pattern holes 121_h may have a same or similar shape as each other. FIG. 1 illustrates that the plurality of pattern holes 121_h have a rectangular shape in the top plan view. However, the invention is not limited thereto. That is, the plurality of pattern holes 121_h may have various shapes in the top plan view, such as a polygon, a circle or an ellipse. However, an exemplary embodiment in which the plurality of pattern holes 121_h having the rectangular shape will be explained hereinafter for convenience.

A distal end 120_e may include an entire width of the deposition mask 120 from the distal edge of the deposition mask 120 to the dummy pattern unit 123. Referring to the above description, an area of the respective distal ends 120_e of the deposition mask 120, which is clamped by a clamp, is referred as a first area of the deposition mask 120. Portions of the distal ends 120_e of the deposition mask 120 at opposing sides of the clamping groove 122 and extending in the first direction are disposed in the first area.

The clamping groove 122 may be in a second area of the respective distal ends 120_e of the deposition mask 120 which is not clamped by a clamp when the deposition mask 120 is extended. That is, the second area of the respective distal ends 120_e is a remaining area of the respective distal ends 120_e excluding the first area thereof, which is described above with reference to FIG. 2. The distal ends 120_e of the deposition mask 120 are opposite to each other with respect to the pattern unit 121. Generally, an inside circumference of the clamping groove 122 is curved to reduce or effectively prevent damage or deformation of the deposition mask 120, which is caused by the tensile force (F) which is applied to the deposition mask 120 to extend the deposition mask 120. The first area may alternate with second areas in the second direction.

The dummy pattern unit 123 may be between the pattern unit 121 and the respective distal ends 120_e of the deposition mask 120 where each of the distal ends 120_e includes the first area and the second area described above. The dummy pattern unit 123 may include a plurality of dummy pattern holes 123_h. The plurality of dummy pattern holes 123_h may not be used for material deposition. In the top plan view, the plurality of dummy pattern holes 123_h may have a shape corresponding to the shape of the plurality of pattern holes 121_h. That is, the plurality of dummy pattern holes 123_h may have various shapes in the top plan view, such as a polygon, a circle and an ellipse, like the shape of the plurality of pattern holes 121_h. Hereinafter, an exemplary embodiment in which the plurality of dummy pattern holes 123_h having a rectangular shape, will be described in detail, for convenience.

Referring to FIG. 3, the deposition mask 120 defines a length dimension thereof (first direction or Y axis direction in FIG. 1) larger than a width dimension thereof (second direction or X axis direction in FIG. 1). The first area of the distal ends 120_e, which is clamped by the clamp, includes an area corresponding to a reference region "A" and an area corresponding to the first direction (Y axis direction), and the second area of the distal ends 120_e, which is not clamped by the clamp, includes an area corresponding to a reference region "B" and an area corresponding to the first direction (Y axis direction).

For the deposition mask 120, a distal end 120_e may include an entire width of the deposition mask 120 from a distal edge of the deposition mask 120 such as to the dummy pattern unit 123 (e.g., where "A" and "B" are indicated). The distal end 120_e may include the dummy pattern unit 123. The second area may be defined by an entire length of the distal end 120_e at which the clamping groove 122 overlaps the clamping groove 122 in the length direction of the deposition mask 120. The first area may be defined by an entire length of the distal end 120_e at which the clamping groove 122 does not overlap the clamping groove 122 in the length direction of the deposition mask 120.

In detail, the dummy pattern unit 123 may overlap at least a portion of the clamping groove 122 with respect to the first direction (Y axis direction). Also, the clamping groove 122 and the dummy pattern unit 123 may each be provided in plural respectively spaced apart from each other along the second direction (X axis direction). The number of the clamping grooves 122 and the number of the dummy pattern units 123 may correspond to each other. Structures of the clamping groove 122 and the dummy pattern unit 123 will be explained in detail below.

Referring back to FIG. 2, in the deposition mask 120P according to the prior art, a dummy pattern unit 123P is disposed as a single dummy pattern unit including a plurality of dummy pattern holes 123P_h, a (deposition) pattern unit 121P is disposed as a single pattern unit including a plurality of deposition pattern holes 121P_h through which a deposition material passes, and a clamping groove 122P is defined. The above-described structure of the dummy pattern unit 123P and the pattern unit 121P may be provided to reduce or effectively prevent deformation of the pattern unit 121P due to the tensile force (F) applied to the deposition mask 120P. In detail, the dummy pattern unit 123P between the pattern unit 121P and the respective distal ends 120P_e has a same width as the pattern unit 121P. Thus, the dummy pattern unit 123P may function to absorb the tensile force transmitted to the pattern unit 121P through the distal ends 120P_e during application of the tensile force (F).

However, the dummy pattern unit 123P does not reduce a wrinkle phenomenon in which different portions of the deposition mask 120P have different heights with respect to a thickness direction (Z axis direction) of the deposition mask 120P.

In contrast, the deposition mask 120 of FIGS. 1 and 3 according to one or more exemplary embodiments of the invention may include the dummy pattern units 123 spaced apart from each other, which partially overlap the clamping grooves 122 in the length direction of the deposition mask 120, respectively, and thus, may reduce the wrinkle phenomenon.

In the conventional deposition mask 120P of FIG. 2, the distal ends 120P_e which are respectively clamped by the clamp when the deposition mask 120 is extended, include a total of three areas, for example, a leftmost area, a rightmost area and a center area along the second (width) direction of the deposition mask 120P. The left, right and center areas generally correspond to portions of the distal ends 120P_e from which the force (F) is shown extended. The tensile force (F, which is applied to the leftmost area and the rightmost area of the distal ends 120P_e, is transmitted to a main body of the deposition mask 120P at which the pattern unit 121P is arranged. However, the tensile force, which is applied to the center area (that is, the reference region "A"), is absorbed by the dummy pattern unit 123P at or near the reference region "A". Accordingly, the tensile force is significantly variable with respect to the second direction in the deposition mask 120P and thus, wrinkles are formed in the deposition mask 120P.

In contrast, in the deposition mask 120 according to one or more exemplary embodiment of the invention as illustrated in FIG. 3, the dummy pattern unit 123 does not exist in the center area corresponding to the reference region "A." Thus, the tensile force (F) applied to the center area of the deposition mask 120, which is the same as the tensile force (F) applied to the left area and the right area of the deposition mask 120, is applied to the pattern unit 121 of the deposition mask 120. That is, the tensile force is more uniformly distributed to the deposition mask 120 than the conventional deposition mask 120P of FIG. 2, with respect to the second direction. Accordingly, in the deposition mask 120 having a structure as illustrated in FIG. 3, the tensile force generated by the clamp is more uniformly distributed to the entire deposition mask 120, and thus, the wrinkle phenomenon, which is generated during extending the deposition mask 120, may be reduced or effectively prevented.

Effects on the above-described improvement of the wrinkle phenomenon will be described with reference to FIGS. 4 and 5.

Figure 4:
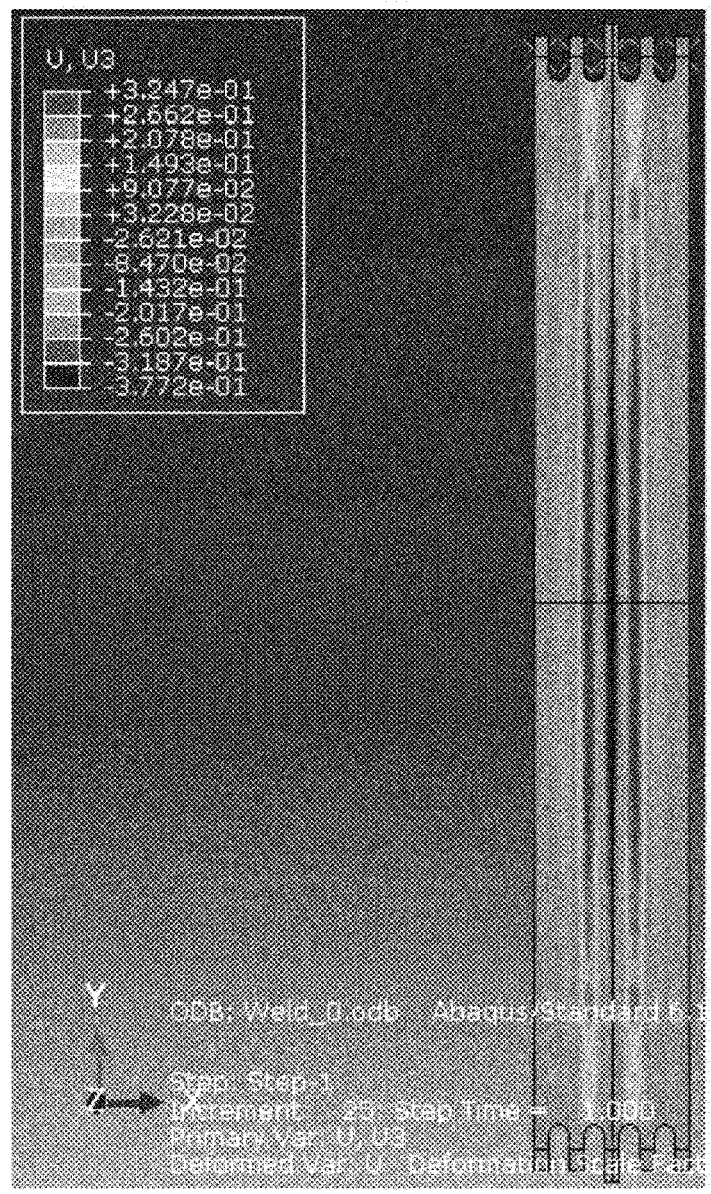
FIG. 4 is a graph illustrating a height of a wrinkle of the conventional deposition mask of FIG. 2.
Figure 5:
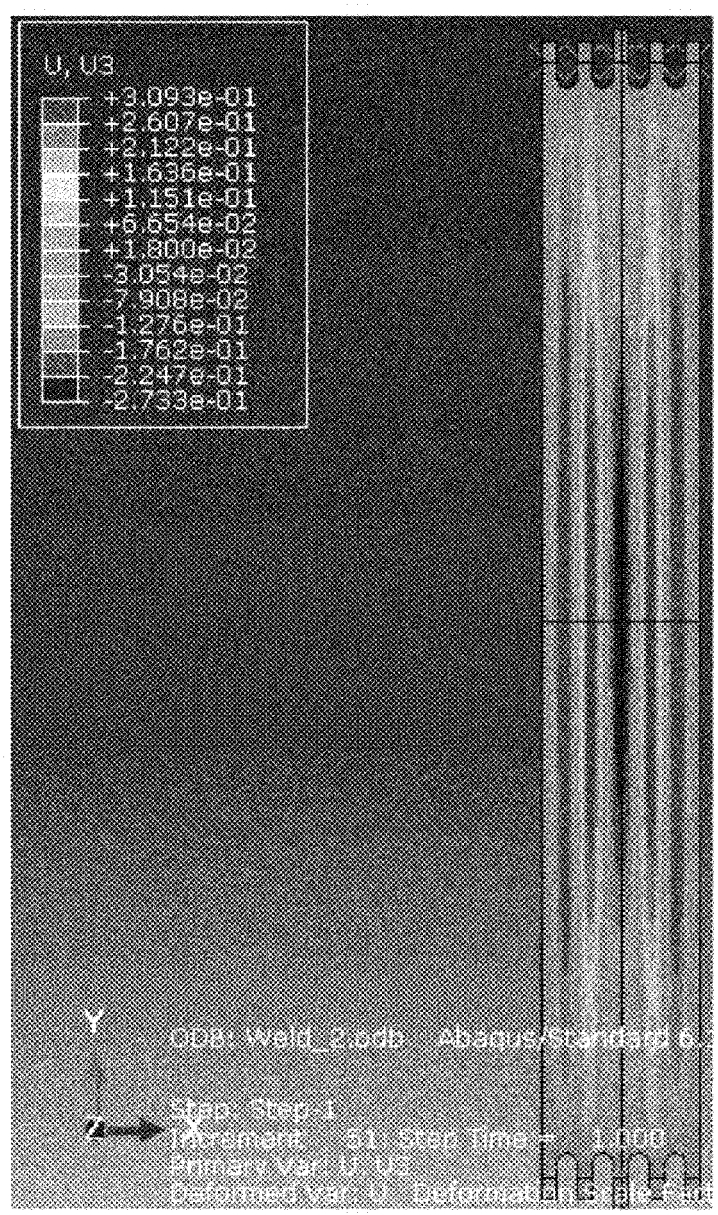
FIG. 5 is a graph illustrating a height of a wrinkle of the deposition mask of FIG. 3.

FIG. 4 is a graph comparatively illustrating heights of wrinkles of the conventional deposition mask 120P of FIG. 2, and FIG. 5 is a graph comparatively illustrating heights of wrinkles of the deposition mask 120 of FIG. 3 according to one or more exemplary embodiment of the invention.

Referring to FIG. 4, a peak-to-peak value of the wrinkles is 701 micrometers (μm) in the conventional deposition mask 120P which includes the dummy pattern unit 123P having a total width corresponding to a total width of the pattern unit 121P as illustrated in FIG. 2.

However, referring to FIG. 5, a peak-to-peak value of the wrinkles is 582 pm in the deposition mask 120 which includes the dummy pattern unit 123 partially overlapping the clamping groove 122 with respect to the first direction and having a width less than that of the pattern unit 121, as illustrated in FIG. 3. The wrinkle phenomenon of the deposition mask 120 may be improved by about 17%, compared to the wrinkle phenomenon of the conventional deposition mask 120P.

FIGS. 4 and 5 illustrate experimental data to compare wrinkles generated by the structure of the conventional deposition mask 120P of FIG. 2 and the structure of an exemplary embodiment of the deposition mask 120 of FIG. 3, to each other. The experimental data to analyze the wrinkle phenomenon of the deposition mask 120 as illustrated in FIG. 5 is based on a structure of the deposition mask 120 in which the dummy pattern unit 123 collectively includes two individual dummy pattern units arranged separated from each other in the second direction as one example. However, the dummy pattern unit 123 may collectively include a different number of individual dummy pattern units separated from each other in the deposition mask 120, and thus, the value of the peak-to-peak of the wrinkles may be changed. Nevertheless, the wrinkles of one or more exemplary embodiment of the deposition mask 120 according to the invention may be significantly reduced as compared to the conventional deposition mask, when the deposition mask 120 includes plural individual dummy pattern units 123 separated from each other to correspond to a number of clamping grooves 122.

Accordingly, the deposition mask 120 having a structure as described above may effectively improve the wrinkle phenomenon. Moreover, a gap, which is formed between the deposition mask 120 and the substrate in the deposition process, may be reduced. Accordingly, the shadow phenomenon may be improved, and thus, the display defect may be reduced.

Figure 6:
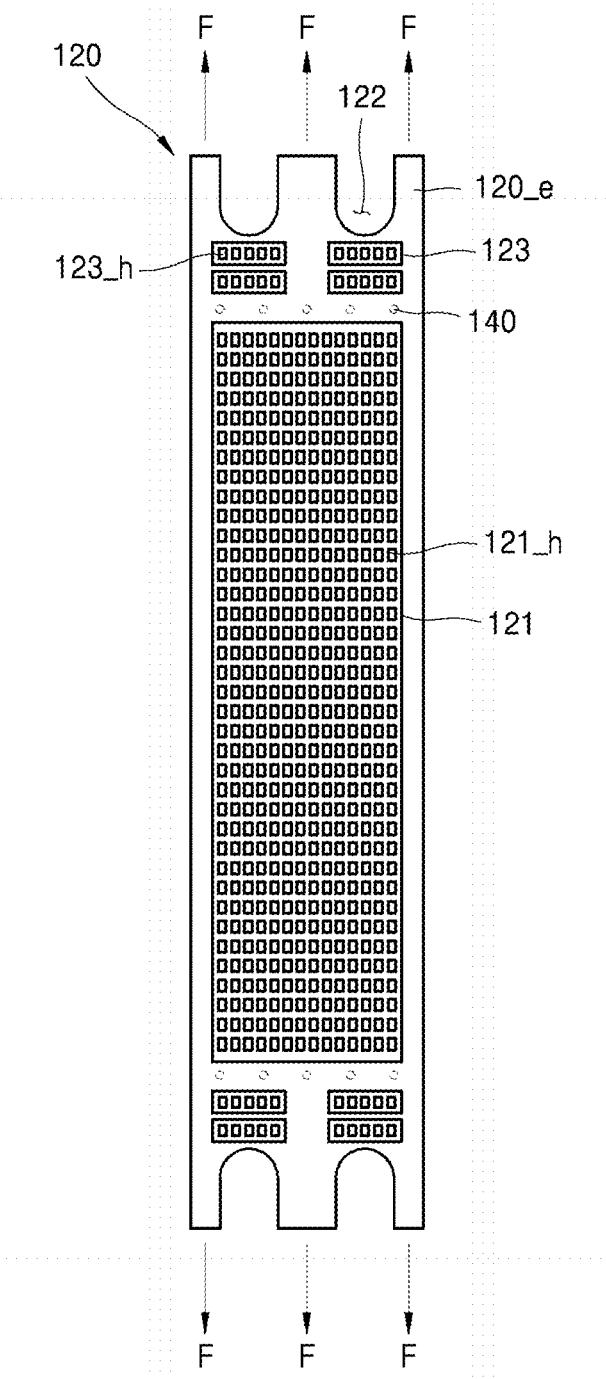
FIG. 6 is a top plan view illustrating another exemplary embodiment of a deposition mask according to the invention.

FIG. 6 is a top plan view illustrating another exemplary embodiment of a deposition mask according to the invention. The deposition mask of FIG. 6 is a modified embodiment of the deposition mask 120 of FIG. 3.

Referring to FIG. 6, the dummy pattern unit 123 may be disposed in plural arranged along the first direction. In more detail, between a same clamping groove 122 and the pattern unit 121, a collective dummy pattern unit includes in the first direction of the deposition mask 120, a first pattern unit (upper 123) and a second pattern unit (lower 123) spaced apart from each other. A solid portion of the deposition mask 120 in which dummy pattern holes 123_h are not formed, is disposed between the first and second pattern units (upper and lower 123) spaced apart from each other. Within each of the first pattern unit (upper 123) and the second pattern unit (lower 123), a plurality of dummy pattern holes 123_h are arranged in the first direction of the deposition mask 120 with a horizontal dummy solid portion of the deposition mask respectively disposed between adjacent dummy pattern holes 123_h in the first direction (e.g., to form a mesh-like pattern along with vertical dummy solid portions). In the first direction of the deposition mask 120, a length of the solid portion between the first and second pattern units (upper and lower 123) spaced apart from each other is greater than a length of the dummy solid portion respectively disposed between the adjacent dummy pattern holes 123_h.

Although FIG. 6 illustrates two dummy pattern units 123 arranged along the first direction, the present disclosure is not limited thereto. That is, the number of the dummy pattern units 123 of FIG. 6 is an exemplary embodiment of the invention. In an alternative exemplary embodiment, More than two of the dummy pattern unit 123 may be disposed in plural in the first direction, for example, three, four, etc.

In detail, the number of the dummy pattern units 123 may be changed according to a size of the deposition mask 120. The size of the deposition mask 120 may be changed according to a size of a display apparatus to be manufactured therewith, and thus, the number of the dummy pattern units 123 may also be changed. Although the number of the dummy pattern units 123 is changed, the number of the clamping grooves 122 of the deposition mask 120 corresponds to the number of the dummy pattern units 123 of the deposition mask 120 arranged in a single line in the first direction. Moreover, at least a portion of the clamping groove 122 overlaps at least a portion of the corresponding dummy pattern unit 123 with respect to the first direction.

Figure 7:
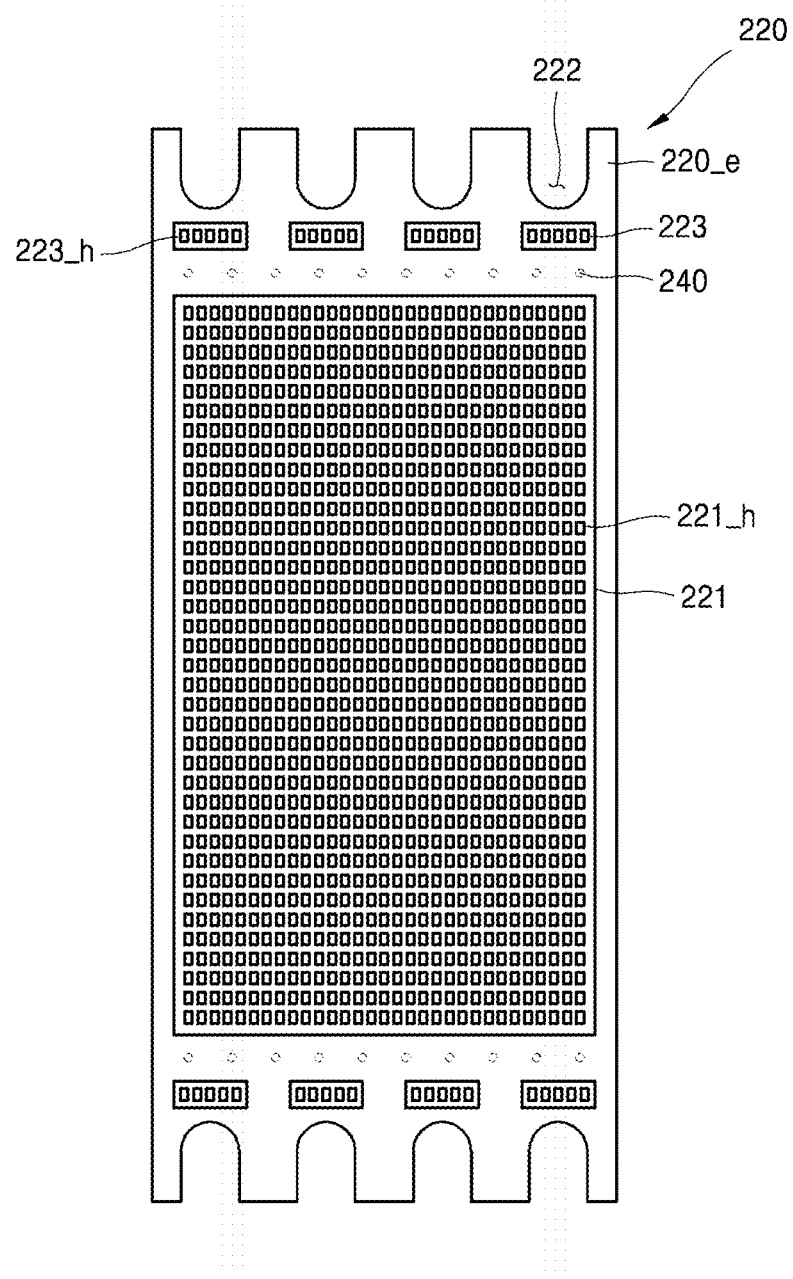
FIG. 7 is a top plan view illustrating still another exemplary embodiment of a deposition mask according to the invention.

FIG. 7 is a top plan view illustrating still another embodiment of the deposition mask according to the invention. The deposition mask of FIG. 7 is a further modified embodiment of the deposition mask 120 of FIG. 3.

Referring to FIG. 7, the deposition mask 220 may include a deposition pattern unit 221 (hereinafter referred to as a "pattern unit 221"), a clamping groove 222 provided in plural and a dummy pattern unit 223 provided in plural.

The deposition mask 120 of FIG. 3 or FIG. 6 may be considered a unit deposition mask. Referring to FIG. 7, a deposition mask 220 may include a structure in which a plurality of deposition masks 120 of FIG. 3 (or FIG. 6) are effectively arranged or attached to each other as one single, unitary body. That is, the deposition mask 220 may include any of various structures of a deposition mask as long as a portion of a clamping groove 222 and a corresponding dummy pattern unit 223 overlap each other along the first direction, and the number of the clamping grooves 222 and the number of the dummy pattern units 223 arranged in the second direction correspond to each other, as described above. Reference numerals 220_e, 223_h, 240, 221_h, and 221 of FIG. 7 correspond to reference numerals 120_e, 123_h, 140, 121_h, and 121 of FIG. 3, respectively, such that repeated description of reference numerals 120_e, 123_h, 140, 121_h, and 121 are omitted for convenience.

Figure 8:
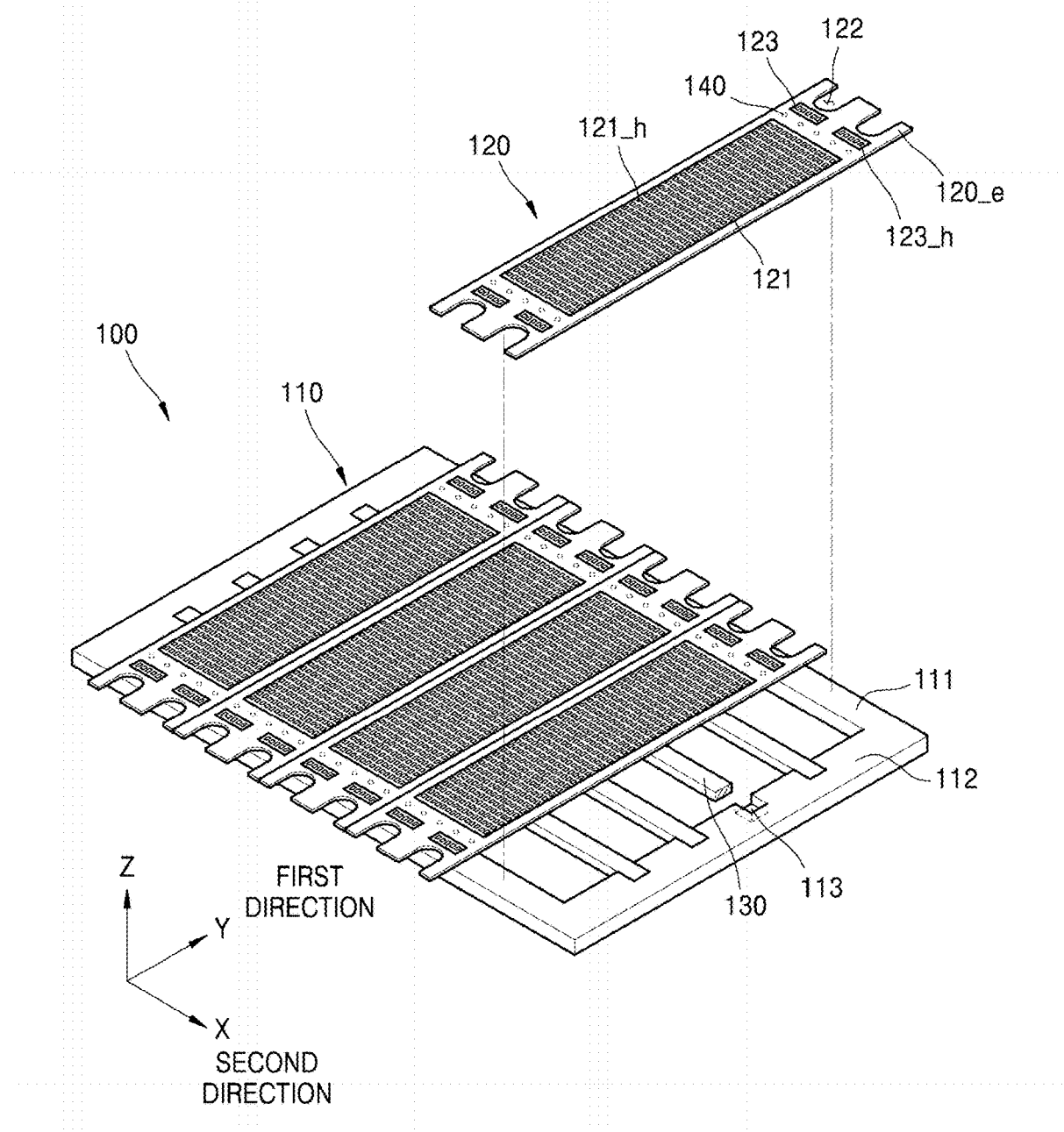
FIG. 8 is a perspective view schematically illustrating an exemplary embodiment of a deposition mask frame assembly including the deposition mask of FIG. 1.

FIG. 8 is a perspective view schematically illustrating an exemplary embodiment of a deposition mask frame assembly 100 including the deposition mask 10 of FIG. 1.

Referring to FIGS. 1 and 8, the deposition mask frame assembly 100 includes the frame 110, a deposition mask 120, and a supporting member 130 (hereinafter referred to as a "support stick 130"). The deposition mask frame assembly 100 may include a plurality of deposition masks 120, and a plurality of support sticks 130.

The frame 110 may include a metal or synthetic resin, and may include one or more openings having an overall rectangular shape in the top plan view. However, the invention is not limited thereto. The opening may have various shapes in the top plan view, for example, a circular shape, a hexagonal shape, etc. For convenience, an exemplary embodiment in which the opening having the rectangular shape in the top plan view, will be explained hereinafter.

The frame 110 may include a pair of first frame members 111 defining lengths thereof extended along a second direction (X axis direction) and a pair of second frame members 112 connected to the corresponding first frames 111 and defining lengths thereof extended along the first direction (Y axis direction). The first frame members 111 and the second frame members 112 form a main opening of the frame 110.

The support stick 130 defines a length thereof extended in the second direction (X axis direction), divides the main opening in to sub-openings, and is coupled to the frame 110. Both of opposing ends in the length direction of the support stick 130 may be inserted into a corresponding groove 113 of the second frame members 112 and may be coupled thereto. The support stick 130 may be coupled to the groove 113 by welding or by an adhesive.

A structure of the deposition mask 120 of FIG. 8 may be same as or similar to a structure of the deposition mask 120 of FIG. 1 and 3 or 220 in FIG. 7, and thus, the structure of the deposition mask 120 of FIG. 8 will be briefly described since the descriptions of the structure of the deposition mask 120 of FIG. 8 correspond to descriptions of the structure of the deposition mask 120 of FIGS. 1 and 3 and 220 in FIG. 7.

As described above, the deposition mask 120 may include a pattern unit 121 including a plurality of pattern holes 121_h, and also include a dummy pattern unit 123 respectively between the pattern unit 121 and the distal ends 120_e of the deposition mask 120. The dummy pattern unit 123 may be provided in plural to define an overall dummy pattern unit including a plurality of individual dummy pattern units 123 arranged along the second direction. A first extension state of the dummy pattern unit 123, that is, an extension state of the reference region "B" of FIG. 3, may be different from a second extension state of the dummy pattern unit 123, that is, an extension state of the reference region "A" of FIG. 3.

The support stick 130 may support a plurality of the deposition masks 120 on the frame 110. Moreover, the support stick 130 may cover a portion of the deposition mask 120 at the pattern unit 121. Accordingly, a deposition material does not pass through the portion of the deposition mask 120 which is covered by the support stick 130, and the deposition material may pass through another portion of the deposition mask 120 which is not covered by the support stick 130. Furthermore, the support stick 130 may disperse a weight of the deposition mask 120 on the frame 110 and may prevent sagging of the deposition mask 120 from the frame 110.

The support stick 130 may include a relatively low magnetic material. In an exemplary embodiment, for example, the support stick 130 may include steel use stainless ("SUS"). A surface of the support stick 130 may contact the deposition mask 120.

If the support stick 130 includes a relatively high magnetic material, a strong attraction force may be generated between the support stick 130 and an electrostatic chuck (180 of FIG. 9A) which urges a portion of the deposition mask 120 at the support stick 130 towards the electrostatic chuck. When the deposition mask 120 is urged towards the electrostatic chuck, a gap is generated between a substrate (11 of FIG. 9A) and the deposition mask 120 or the pattern unit 121 of the deposition mask 120 is not aligned with the substrate 11. Accordingly, in one or more exemplary embodiment, the support stick 130 may include a relatively low magnetic material so that the substrate (11 of FIG. 9A) and the deposition mask 120 is in close contact with each other, and the pattern unit 121 of the deposition mask 120 is precisely aligned with the substrate 11.

Figure 9A:
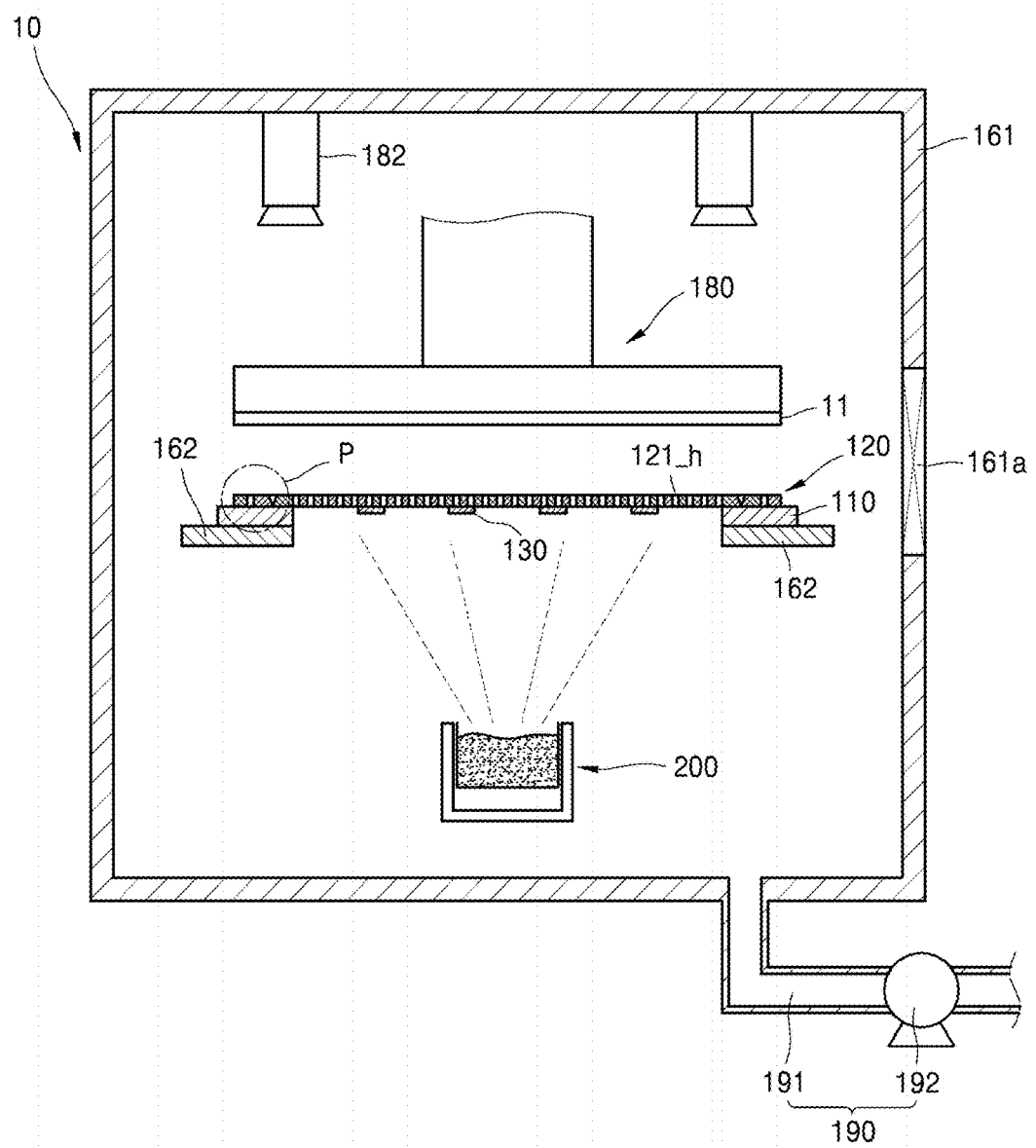
FIG. 9A is a cross-sectional view schematically illustrating an exemplary embodiment of a manufacturing apparatus including the deposition mask frame assembly of FIG. 8 for manufacturing a display apparatus.
Figure 9B:
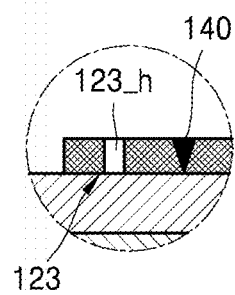
FIG. 9B is an enlarged cross-sectional view of portion P of the manufacturing apparatus including the deposition mask frame assembly of FIG. 8.

FIG. 9A is a cross-sectional view schematically illustrating an exemplary embodiment of a manufacturing apparatus 10 including the deposition mask frame assembly 100 of FIG. 8 for manufacturing a display apparatus. FIG. 9B is an enlarged cross-sectional view of a portion P of the manufacturing apparatus including the deposition mask frame assembly of FIG. 8;

The manufacturing apparatus 10 may include a deposition source 200, a chamber 161 in which the deposition mask frame assembly 100 is disposed and deposition material is deposited on a substrate, a supporter 162, an electromagnetic chuck 180 and a vision unit 182. Here, the deposition mask frame assembly 100 of FIG. 9A is the same as the deposition mask frame assembly of FIG. 8. Accordingly, descriptions of the deposition mask frame assembly 100 of FIG. 9A will be omitted since the descriptions of the deposition mask frame assembly 100 of FIG. 9A correspond to descriptions of the deposition mask frame assembly 100 of FIG. 8.

The deposition source 200 may be arranged to face the deposition mask frame assembly 100, and a portion of the deposition source 200 may be open to face the deposition mask frame assembly 100. Deposition material may be exposed outside the deposition source 200 at the open face thereof. Moreover, the deposition source 200 may include a heater (not illustrated) to heat the deposition material.

The deposition material may be received inside the deposition source 200. Here, the deposition material may include one or more of an inorganic material, a metal, and an organic material as a material which is vaporized or gasified. However, as an exemplary embodiment, the deposition material as the organic material, will be described hereinafter.

An airtight space is formable inside the chamber 161, and a portion of the chamber 161 may be openable such as to insert and remove the deposition mask assembly 100 and/or elements thereof from the chamber 161. Here, a gate valve 161a may be installed at the openable portion of the chamber 161 and thus, the gate valve 161a may close or open the portion of the chamber 161 for insertion or removal of the deposition mask assembly 100 and/or elements thereof.

The deposition mask frame assembly 100 may be placed over the supporter 162. Here, the supporter 162 may rotate and/or linearly move the deposition mask frame assembly 100 within the chamber 161.

The electromagnetic chuck 180 may align the substrate 11 relative to the deposition mask frame assembly 100, such as disposing the substrate 11 on the deposition mask frame assembly 100 within the chamber 161. The electromagnetic chuck 180 may hold the substrate 11 by using an electromagnetic force such as when the substrate 11 is separated from the deposition mask assembly 100. The electromagnetic chuck 180 may align the substrate 11 over the deposition mask frame assembly 100 within the chamber 161. Here, by using the vision unit 182, the substrate 11 may be precisely aligned over the deposition mask frame assembly 100 within the chamber 161.

The manufacturing apparatus 10 may deposit the deposition material on the substrate 11 after supporting the substrate 11 as described above. In another exemplary embodiment, the deposition material may be deposited on the substrate 11 while the substrate 11 and the deposition source 200 relatively move with respect to each other. However, an exemplary embodiment in which the deposition material is deposited on the substrate 11 while the substrate 11 is supported in a static position within the manufacturing apparatus 10, will be described hereinafter, for convenience.

A pressure controller 190 may be installed to be in communication with the chamber 161. The pressure controller 190 may include a connection pipe 191 connected to the chamber 161 and a pump 192 which is installed at the connection pipe 191.

The manufacturing apparatus 10 as described above may form an organic layer, an inorganic layer or a metal layer on the substrate 11. However, an exemplary embodiment in which the manufacturing apparatus 10 forms the organic layer on the substrate 11, will be described hereinafter, for convenience.

In an operation of the manufacturing apparatus 10, the substrate 11 and the deposition mask frame assembly 100 are inserted into an inside of the chamber 161 and then supported by the supporter 162 within the chamber 161.

Locations of the substrate 11 and the deposition mask frame assembly 100 are determined by using the vision unit 182, and then the substrate 11 and the deposition mask frame assembly 100 may be aligned with each other by using the electromagnetic chuck 180. In an exemplary embodiment, the vision unit 182 may include a camera to photograph the substrate 11 and the deposition mask frame assembly 100, and such photograph may be used to determine positions of elements within the chamber 161.

The electromagnetic chuck 180 may hold the substrate 11 and the deposition mask frame assembly 100 relative to each other by using the electromagnetic force generated by the electromagnetic chuck 180. Here, the electromagnetic chuck 180 may reduce a gap between the substrate 11 and the deposition mask frame assembly 100 so that the substrate 11 and the deposition mask frame assembly 100 are in close contact with each other within the chamber 161.

After the substrate 11 and the deposition mask frame assembly 100 are aligned with each other, the deposition material may be vaporized or gasified by operating the deposition source 200. Here, the deposition material may pass from the deposition source 200 (dotted lines in FIG. 9A) through the plurality of pattern holes 121_h of the plurality of deposition masks 120 of the deposition mask frame assembly 100 and then may be deposited on the substrate 11. Thereafter, the substrate 11, on which a depositing process is completed by having the deposition material thereon, is taken out from the chamber 161 and then a following process may be performed on the substrate 11.

Referring to FIG. 9B, at portion P of the manufacturing apparatus 10 including the deposition mask frame assembly 100 therein, the frame 110 and the deposition mask 120 may be coupled to each other at a welding portion 140 of the deposition mask 120. The welding portion 140 and the dummy pattern unit 123 along with the dummy pattern holes 123_h thereof, overlap the supporter 162. Since the dummy pattern unit 123 along with the dummy pattern holes 123_h are each overlapped by the supporter 162, deposition material does not pass through the dummy pattern holes 123_h to the substrate 11. That is, the dummy pattern unit 123 does not participate in the process of depositing material onto the substrate 11. The distal ends (120_e of FIGS. 3 and 6 and 220_e) of the deposition mask 120 in FIGS. 9A and 9B may be defined as a portion of the deposition mask 120 which is disposed to overlap the frame 110 and/or the supporter 162, but the invention is not limited thereto.

Figure 10:
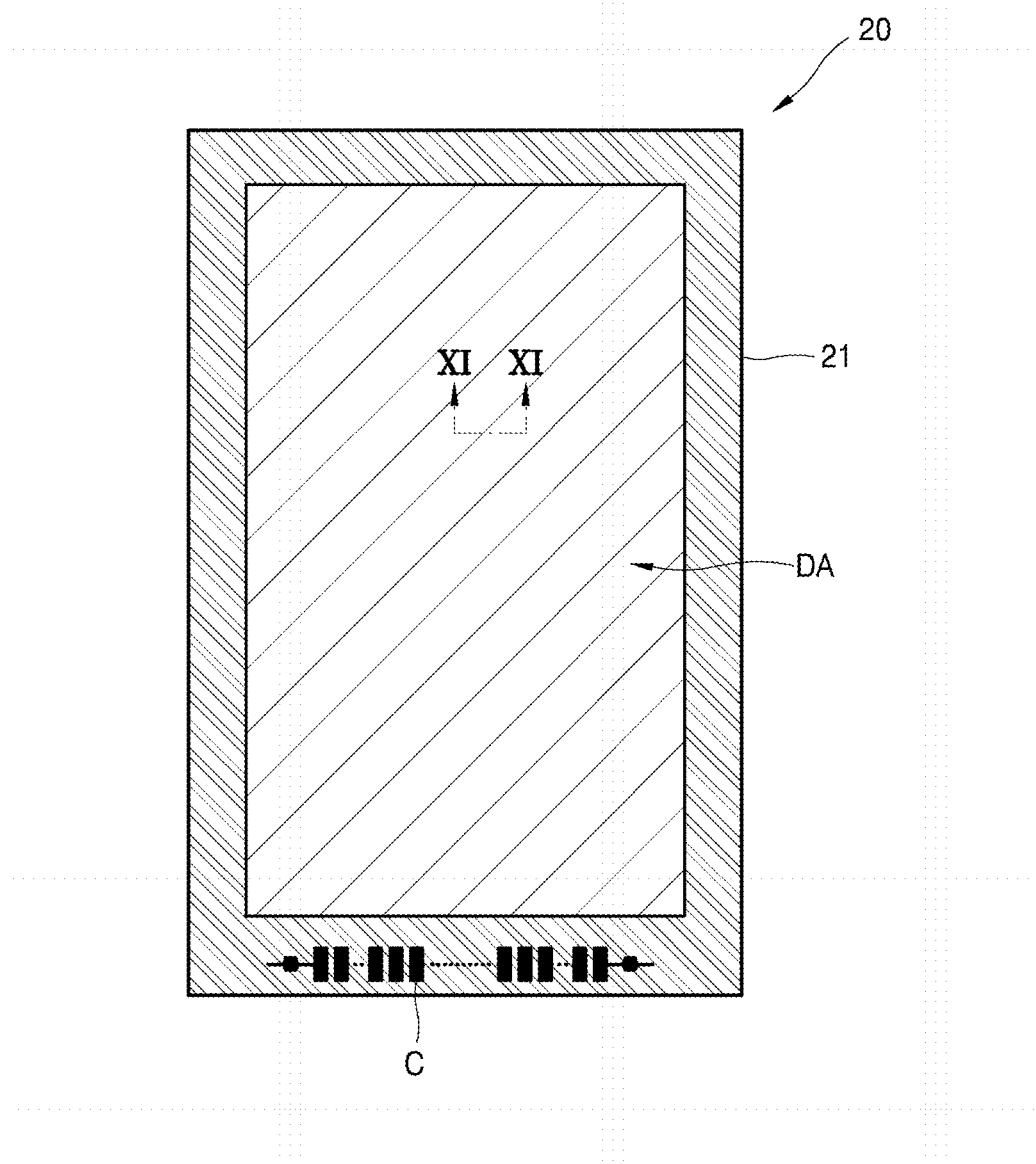
FIG. 10 is a top plan view illustrating the display apparatus manufactured by the manufacturing apparatus of FIG. 9A and a method of manufacturing the display apparatus using the manufacturing apparatus, according to the invention.
Figure 11:
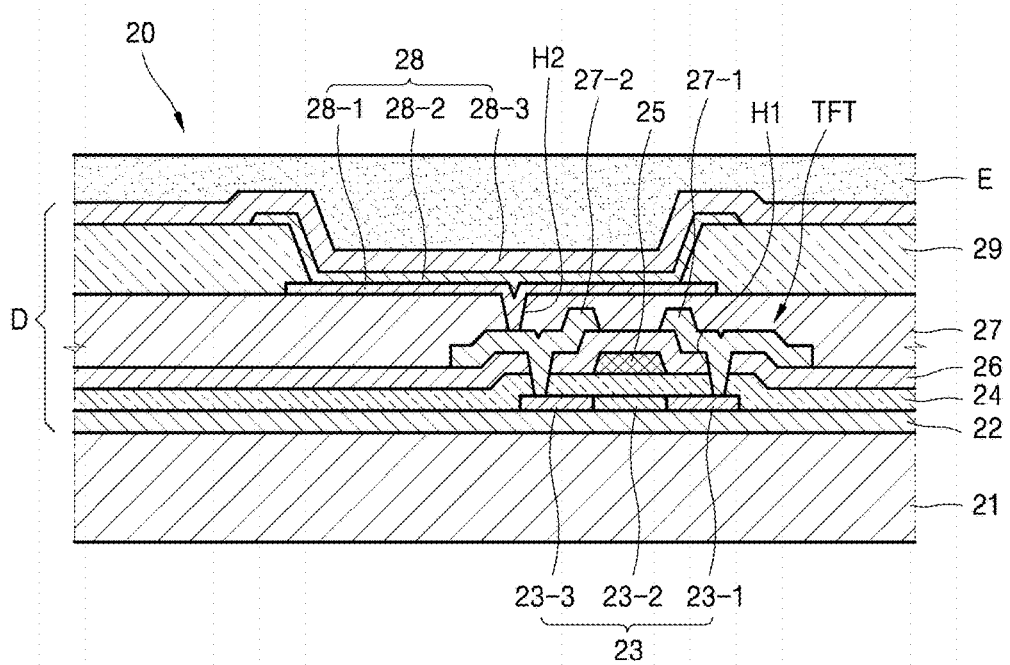
FIG. 11 is a cross-sectional view taken along line XI-XI of FIG. 10.

FIG. 10 is a top plan view illustrating an exemplary embodiment of a display apparatus 20 which is manufactured by the manufacturing apparatus 10 of FIG. 9A and a method of manufacturing the display apparatus using the manufacturing apparatus 10, according to the invention, and FIG. 11 is a cross-sectional view taken along line XI-XI of FIG. 10.

Referring to FIGS. 10 and 11, the display apparatus 20 may include a display area DA which is defined for a substrate 21, and a non-display area (not illustrated) at an outer circumference of the display area DA. Planar areas of the non-display area and the display area DA may define an entirety of a planar area of the substrate 21. A light-emitting unit D is arranged in the display area DA, and power wirings (not illustrated) are arranged in the non-display area to be connected to the light-emitting unit D. A pad area C to which signals and/or power is applied to the substrate 21 and elements thereon, may be arranged in the non-display area.

The display apparatus 20 may include the substrate 21 and the emission D disposed on the substrate 21. The display apparatus 20 may further include an encapsulating layer E over an upper portion of the light-emitting unit D. Here, the substrate 21 may include a plastic material or a metal material, such as steel use stainless ("SUS"), titanium (Ti), etc. Also, the substrate 21 may include polyimide ("PI").

The light-emitting unit D may be disposed over the substrate 21, that is, on an upper surface thereof. Here, the light-emitting unit D may include a thin film transistor TFT, a passivation film 27 covering the thin film transistor TFT, and an organic light-emitting device ("OLED") 28 over the passivation film 27.

Here, the substrate 21 may include a glass material. However, the invention is not limited thereto. The substrate 21 may include a plastic material or a metal such as SUS, Ti, etc. Also, the substrate 21 may include the PI. For convenience, an exemplary embodiment in which the substrate 21 includes a glass material, will be explained in detail hereinafter.

A buffer layer 22 may be over the upper surface of the substrate 21 and may include an organic compound and/or an inorganic compound. The buffer layer 22 may include silicon oxide (SiOx) where $x \geq 1$ or silicon nitride (SiNx) where $x \geq 1$.

An active layer 23 is disposed or formed as a collection of a plurality of patterns which are arranged over the buffer layer 22. A gate insulating layer 24 is disposed or formed over the active layer 23 to bury the active layer 23. The active layer 23 may include a source area 23-1, a drain area 23-3, and a channel area 23-2 between the source area 23-1 and the drain area 23-3.

The active layer 23 may include various materials. In an exemplary embodiment, for example, the active layer 23 may include an inorganic semiconductor material, such as amorphous silicon or crystal silicon. In another exemplary embodiment, the active layer 23 may include an organic semiconductor material. However, an exemplary embodiment in which the active layer 23 includes amorphous silicon, will be explained in detail hereinafter.

The active layer 23 may be disposed or formed by forming a preliminary layer of amorphous silicon over the buffer layer 22, crystallizing the preliminary layer of amorphous silicon to form a polycrystalline, and patterning the polycrystalline. The active layer 23 may include the source area 23-1 and the drain area 23-3 which are formed by doping a same material layer for forming the active layer 23 with impurities according to a kind of the thin film transistor TFT, such as a driving thin film transistor (not illustrated) and a switching thin film transistor (not illustrated). The source area 23-1, the drain area 23-3 and the channel area 23-2 may be formed from a same material layer for forming the active layer 23, where the channel area 23-2 portion thereof is not doped or doped differently from the source and drain areas 23-1 and 23-3.

A gate electrode 25 is disposed or formed over the gate insulating layer 24 to correspond to the active layer 23, and then an interlayer insulating layer 26 is disposed or formed to bury the gate electrode 25.

A contact hole H1 is disposed or formed in plural extended through the interlayer insulating layer 26 and the gate insulating layer 24 to expose the source area 23-1 and the drain area 23-3, respectively. A source electrode 27-1 and a drain electrode 27-2 are disposed or formed over the interlayer insulating layer 26 and contact the source area 23-1 and the drain area 23-3, respectively, at the contact holes H1.

The passivation film 27 is disposed or formed over the thin film transistor TFT, and a pixel electrode 28-1 of the organic light-emitting device OLED is disposed or formed over the passivation film 27. The pixel electrode 28-1 contacts the drain electrode 27-2 of the thin film transistor TFT at a via hole H2 which is disposed or formed extended through the passivation film 27. The passivation film 27 may include an inorganic material, an organic material, a single layer, or a multilayer having two or more layers. The passivation film 27 may be a planarization film having a flat upper film surface regardless of a curved lower film surface thereof. However, alternatively, the passivation film 27 may have a curved upper film surface according to the curved lower film surface. The passivation film 27 may include a transparent insulating material to attain resonance effects.

A pixel defining film 29 is disposed or formed to cover the pixel electrode 28-1 and the passivation film 27. The pixel defining film 29 includes an organic material and/or an inorganic material. An opening is disposed or formed in the pixel defining film 29 to expose the pixel electrode 28-1 to outside the pixel defining film 29.

An intermediate layer 28-2 and an opposite electrode 28-3 are disposed or formed over the pixel electrode 28-1.

The pixel electrode 28-1 may function as an anode and the opposite electrode 28-3 may function as a cathode of the OLED 28. In an exemplary embodiment, t is possible that polarities of the pixel electrode 28-1 and the opposite electrode 28-3 may be reversed.

The pixel electrode 28-1 and the opposite electrode 28-3 may be insulated from each other by the intermediate layer 28-2, and voltages with different polarities are applied to the intermediate layer 28-2 such that light is emitted from the intermediate layer 28-2 as an organic emission layer.

The intermediate layer 28-2 may include the organic emission layer. In another exemplary embodiment, the intermediate layer 28-2 may include the organic emission layer and additionally include at least one of a hole injection layer ("HIL"), a hole transport layer ("HTL"), an electron transport layer ("ETL"), and an electron injection layer ("EIL"). However, the present disclosure is not limited thereto. The intermediate layer 28-2 may include the organic emission layer and additionally include various functional layers (not illustrated).

Here, the intermediate layer 28-2 of the display apparatus may be formed an apparatus (not illustrated) to manufacture the display apparatus 20 described above. In an exemplary embodiment, the intermediate layer 28-2 may be precisely formed by one or more exemplary embodiment of the manufacturing apparatus 10 of FIGS. 9A and 9B and a method of manufacturing the display apparatus using the manufacturing apparatus 10, according to the invention.

A unit pixel may be defined in plural in the display area DA of the substrate 21. An image may be displayed by the unit pixel. The unit pixel may include a plurality of sub-pixels, and the plurality of sub-pixels may respectively emit various different colors of light within the unit pixel. In an exemplary embodiment, for example, the plurality of sub-pixels may include sub-pixels respectively emitting a red color light, a green color light and a blue color light or sub-pixels respectively emitting the red color light, the green color light, the blue color light and a white color light.

The encapsulating layer E may include a plurality of inorganic layers or may include an inorganic layer and an organic layer.

The organic layer of the encapsulating layer E may include a polymer. The organic layer of the encapsulating layer E may include a single film or a stack film including at least one of polyethylene terephthalate, polyimide, polycarbonate, epoxy, polyethylene, and polyacrylate. The organic layer of the encapsulating layer E may include polyacrylate. The organic layer of the encapsulating layer E may include a diacrylate-based monomer or a polymerized monomer compound including the diacrylate-based monomer. A monoacrylate-based monomer may be added to the monomer compound. Also, a photoinitiator, such as Diphenyl(2,4,6-trimethylbenzoyl)phosphine oxide (TPO), may be added to the monomer compound. However, the present disclosure is not limited thereto.

The inorganic layer of the encapsulating layer E may include a single film or a stack film, which may include metal oxide or metal nitride. The inorganic layer of the encapsulating layer E may include one of silicon nitride ($SiN_x$), aluminum oxide ($Al_2O_3$), silicon oxide ($SiO_2$), and titanium oxide ($TiO_2$).

An uppermost layer of the encapsulating layer E may include an inorganic layer to prevent introduction of moisture into the organic light-emitting device ("OLED").

The encapsulating layer E may include at least one sandwiched structure in which at least one organic layer is inserted into at least two inorganic layers. In another embodiment, the encapsulating layer E may include at least one sandwiched structure in which at least one inorganic layer is inserted into at least two organic layers. In another embodiment, the encapsulating layer E may include at least one sandwiched structure in which at least one organic layer is interposed between at least two inorganic layers, and at least one sandwiched structure in which at least one inorganic layer is interposed between at least two organic layers.

The encapsulating layer E may include a first inorganic layer, a first organic layer, and a second inorganic layer, which are disposed in order from an upper portion of the organic light-emitting device ("OLED").

In another embodiment, the encapsulating layer E may include a first inorganic layer, a first organic layer, a second inorganic layer, a second organic layer, and a third inorganic layer, which are disposed in order from the upper portion of the organic light-emitting device ("OLED").

In another embodiment, the encapsulating layer E may include a first inorganic layer, a first organic layer, a second inorganic layer, a second organic layer, a third inorganic layer, a third organic layer, and a fourth inorganic layer, which are disposed in order from the upper portion of the organic light-emitting device ("OLED").

A halogenated metal layer including lithium fluoride (LiF) may be added between the organic light-emitting device ("OLED") and the first inorganic layer of the encapsulating layer E. the halogenated metal layer may prevent damage of the organic light-emitting device ("OLED") during forming the first inorganic layer by using a sputtering method.

An area of the first organic layer may be smaller than an area of the second inorganic layer, and an area of the second organic layer may be smaller than an area of the third inorganic layer.

Accordingly, since the display apparatus 20 includes the intermediate layer 28-2 having a precisely-formed pattern and the intermediate layer 28-2 is deposited and formed at an accurate location of the display apparatus 20 by one or more exemplary embodiment of the manufacturing apparatus 10 of FIGS. 9A and 9B and a method of manufacturing the display apparatus using the manufacturing apparatus 10, according to the invention, a precise image may be realized in the display apparatus 20. Moreover, a constant pattern among unit pixels of the display apparatus 20 may be maintained by one or more exemplary embodiment of the manufacturing apparatus 10 of FIGS. 9A and 9B and a method of manufacturing the display apparatus using the manufacturing apparatus 10, according to the invention such that uniform quality within the display apparatus 20 by continuous productions when the intermediate layer 28-2 is repeatedly deposited on the substrate 21 in forming the display apparatus 20.

It should be understood that embodiments described herein should be considered in a descriptive sense only and not for purposes of limitation. Descriptions of features within each embodiment should typically be considered as available for other similar features in other embodiments.

While one or more embodiments have been described with reference to the figures, it will be understood by those of ordinary skill in the art that various changes in form and details may be made therein without departing from the spirit and scope as defined by the following claims.

What is claimed is:

1. A deposition mask for depositing a deposition material on a substrate, comprising:
    a deposition pattern unit comprising a plurality of deposition pattern holes through which the deposition material passes to the substrate; and
    a distal end extended in a first direction of the deposition mask from the deposition pattern unit to a distal edge of the deposition mask, the distal end comprising:
        a clamping groove open at the distal edge of the deposition mask; and
        a dummy pattern unit disposed between the clamping groove and the deposition pattern unit in the first direction of the deposition mask;
    wherein
    the clamping groove and the dummy pattern unit are provided in plural along a second direction crossing the first direction of the deposition mask, and
    in the first direction of the deposition mask,
        a portion of each clamping groove overlaps a corresponding dummy pattern unit,
    in the second direction of the deposition mask, the number of the clamping grooves and the number of the dummy pattern units correspond to each other,
    an area of the distal end at which the portion of the distal end does not overlap the corresponding dummy pattern unit defines a first area of the distal end to which a clamp is applied, and
    an area of the distal end at which the portion of each clamping groove overlaps the corresponding dummy pattern unit defines a second area of the distal end.

2. The deposition mask of claim 1, wherein
    the dummy pattern unit comprises a plurality of dummy pattern holes, and
    a shape of one of the plurality of dummy pattern holes corresponds to a shape of one of the plurality of the deposition pattern holes.

3. The deposition mask of claim 1, wherein
    the dummy pattern unit comprises a plurality of dummy pattern holes, and
    a shape of one of the plurality of dummy pattern holes is different from a shape of one of the plurality of the deposition pattern holes.

4. The deposition mask of claim 1, wherein
    in the first direction of the deposition mask, the dummy pattern unit comprises a first dummy pattern unit and a second dummy pattern unit spaced apart from each other, each of the first and second dummy pattern units comprising a plurality of dummy pattern holes.

* * * * *